United States Patent [19]
Northey

[11] Patent Number: 5,419,713
[45] Date of Patent: May 30, 1995

[54] ELECTRICAL CONNECTOR WITH SELF-RETAINED BOARDLOCK

[75] Inventor: William A. Northey, Etters, Pa.

[73] Assignee: Berg Electronics, Etters, Pa.

[21] Appl. No.: 162,648

[22] Filed: Dec. 6, 1993

[51] Int. Cl.⁶ .................. H01R 13/62; H01R 9/09
[52] U.S. Cl. ............................. 439/329; 439/78
[58] Field of Search ............ 439/78, 79, 329, 567, 439/813, 571, 573

[56] References Cited

U.S. PATENT DOCUMENTS

| | | | |
|---|---|---|---|
| 3,902,777 | 9/1975 | Anhalt et al. | 339/17 C |
| 4,645,287 | 2/1987 | Olsson | 339/125 R |
| 4,681,389 | 7/1987 | Nakazawa et al. | 439/557 |
| 4,735,587 | 4/1988 | Kirayoglu | 439/751 |
| 4,907,987 | 3/1990 | Douty et al. | 439/571 |
| 4,938,704 | 7/1990 | Fujiura | 439/95 |
| 4,953,061 | 8/1990 | Nitkiewicz | 361/417 |
| 5,066,237 | 11/1991 | Shiley | 439/82 |
| 5,080,611 | 1/1992 | Hypes | 439/567 |
| 5,083,942 | 1/1992 | Hahn | 439/567 |
| 5,135,412 | 8/1992 | Sitzler | 439/571 |
| 5,184,963 | 2/1993 | Ishikawa | 439/79 |
| 5,228,870 | 7/1993 | Gorenc et al. | 439/567 |
| 5,336,111 | 8/1994 | Thrush et al. | 439/567 |

FOREIGN PATENT DOCUMENTS 61-28905  2/1986  Japan.
63-172071 11/1988 Japan.
1-42645  12/1989 Japan.

OTHER PUBLICATIONS

Lasky et al., *IBM Tech. Discl. Bull.*, vol. 17, No. 3, Aug. 1974, p. 715.

Meiboom, "Miniature Pluggable Contacts", IBM Disclosure Bulletin, vol. 5, No. 5, Oct. 1962, p. 26.

*Primary Examiner*—Mark Rosenbaum
*Assistant Examiner*—Jeffrey T. Knapp
*Attorney, Agent, or Firm*—Woodcock, Washburn, Kurtz, Mackiewicz & Norris

[57] ABSTRACT

An electrical connector has a self-retaining boardlock in which the barbs of the boardlock not only secure the electrical connector to the printed circuit board but also retain the boardlock within a boardlock retaining aperture of the electrical connector prior to connection of the electrical connector to a printed circuit board. The boardlock is preferably pressed into a molded hex nut opening of the electrical connector by fitting a tab portion of the boardlock in opposing corners of the hex opening. The other end of the boardlock has spring means with barbs thereon which protrude through the boardlock retaining aperture of the electrical connector and spring outward to retain the boardlock in the aperture during shipment of the electrical connector.

9 Claims, 3 Drawing Sheets

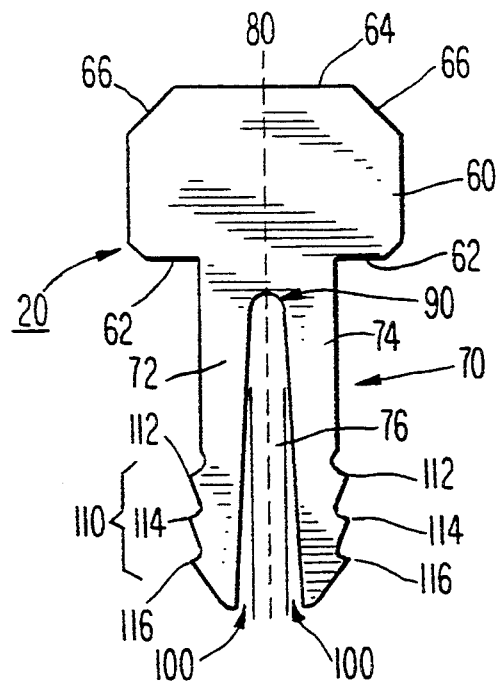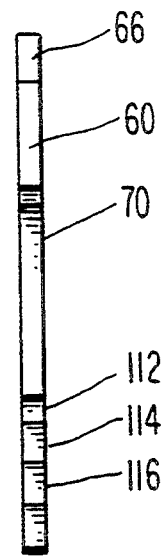
Fig. 2     Fig. 3
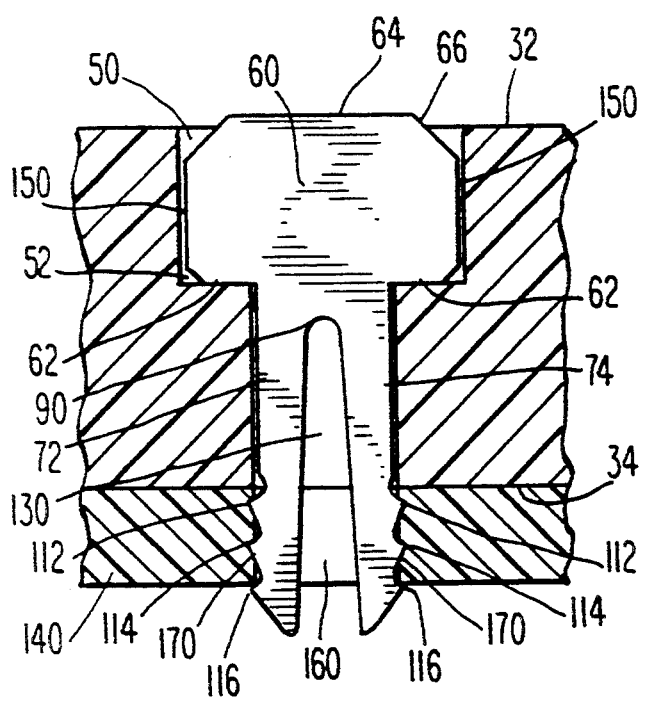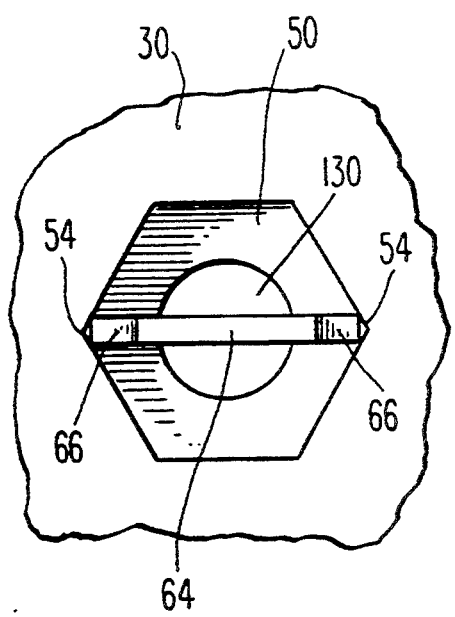
Fig. 4     Fig. 5

ELECTRICAL CONNECTOR WITH SELF-RETAINED BOARDLOCK

BACKGROUND OF THE INVENTION

1. Field of the Invention

The present invention relates to an electrical connector and, in particular, to an electrical connector having a self-retained boardlock for securing the electrical connector to a printed circuit board ("PCB").

2. Description of the Prior Art

Numerous techniques are known for securing electrical connectors to printed circuit boards. For example, corresponding through holes may be provided in the electrical connectors and the printed circuit boards for accepting a screw and a nut which are tightened to secure the connector to the printed circuit board. Such a technique works quite well but is relatively tedious and requires substantial assembly time. As a result, boardlocks, clips, and the like have been developed for securing the electrical connector to the printed circuit board without the use of any tools.

Boardlocks, clips, and the like come in numerous shapes and sizes and are generally passed through apertures in the electrical connector and the printed circuit board for securing the electrical connector to the printed circuit board. The hold down mechanism typically comprises "Christmas tree-shaped" barbs on the boardlock or clip which engage the printed circuit board to provide an interference fit with the boardlock receiving aperture of the printed circuit board. The boardlocks, clips, and the like are typically retained in the boardlock receiving aperture of the electrical connector housing prior to connection to the printed circuit board by way of an interference fit between the boardlock and the boardlock receiving aperture of the electrical connector as described, for example, by Douty et al. in U.S. Pat. No. 4,907,987, by Hypes in U.S. Pat. No. 5,080,611, and by Sitzler in U.S. Pat. No. 5,135,412. Other boardlocks, clips, and the like are shipped separately from the electrical connectors or are constrained in narrow through slots and the like in the electrical connector using projections such as barbs which extend through the through slots of the electrical connector to fasten the electrical connector in position relative to corresponding holes in the printed circuit board. Such fasteners are described, for example, by Ishikawa in U.S. Pat. No. 5,184,963 and are also illustrated in Japanese Pat. No. 61-28905. Still other electrical connectors use clips or lock pins for mounting the electrical connector on the printed circuit board without the use of barbs. Such clips or lock pins are described, for example, by Olsson in U.S. Pat. No. 4,645,287 and by Nakazawa et al. in U.S. Pat. No. 4,681,389.

Unfortunately, boardlocks, clips, and lock pins of the type described in the aforementioned patents cannot readily be shipped with the electrical connectors without falling out or otherwise separating from the electrical connectors. Due to the small size of these elements, it is generally undesirable that they be shipped separately. Indeed, even boardlocks with an interference fit may back out of the boardlock retaining apertures of the electrical connectors and be separated from the electrical connectors during shipment.

Accordingly, an improved boardlock is desired which retains itself within the boardlock retaining aperture of the electrical connector so that it will not fall out or back out during shipment of the electrical connector. It is also desired that the boardlock be usable in conventional screw and hex nut apertures so that additional tooling of the electrical connector is not required and so that the purchaser will have numerous assembly options. The present invention has been designed to meet these needs.

SUMMARY OF THE INVENTION

The present invention relates to an electrical connector having a boardlock which retains itself in the boardlock retaining aperture of the electrical connector during shipment. The boardlock is designed to have a tab at a first end for preventing the boardlock from passing into the through hole of the boardlock retaining aperture of the electrical connector and spring means at a second end having barbs which spring outward to retain the boardlock in the boardlock retaining aperture of the electrical connector during shipment. Since the boardlock is retained in the boardlock retaining aperture of the electrical connector by the tab at one end and the barbs of the spring means at the other end, the boardlock fits loosely in the boardlock retaining aperture and does not require an interference fit with the boardlock retaining aperture for retaining the boardlock in the boardlock retaining aperture. Since no interference fit is necessary, the dimensions of the boardlock retaining aperture are not critical. As a result, the boardlock may be used in conventional screw and hex nut recesses within the electrical connector without additional tooling requirements.

The electrical connector of the invention may be readily connected to a printed circuit board after shipment by aligning the boardlock of the electrical connector with the boardlock receiving aperture of the printed circuit board and then pressing the top portion of the boardlock which preferably extends slightly above the top face of the electrical connector when the boardlock is completely within the boardlock retaining aperture of the electrical connector. Of course, the top portion of the boardlock may be flush with the top face of the electrical connector if desired. The barbs of the spring means of the boardlock provide an interference fit with the walls of the boardlock retaining aperture of the printed circuit board so that the electrical connector is suitably retained in contact with the printed circuit board.

BRIEF DESCRIPTION OF THE DRAWINGS

The invention will be more fully understood from the following detailed description taken in accordance with the accompanying drawings forming a part of this application, in which:

FIG. 2 illustrates a front view of a self-retaining boardlock in accordance with the invention.

FIG. 3 illustrates a side view of the self-retaining boardlock of FIG. 2.

FIG. 4 illustrates an end view, partially in section, of a boardlock secured in an aperture of the electrical connector with the electrical connector mounted on a printed circuit board.

FIG. 5 illustrates a top view of the self-retaining boardlock of the invention placed in a hexagonal recess conventionally used for accepting a hex nut which receives a screw to hold the electrical connector to the printed circuit board.

DETAILED DESCRIPTION OF THE INVENTION

Figure 1:
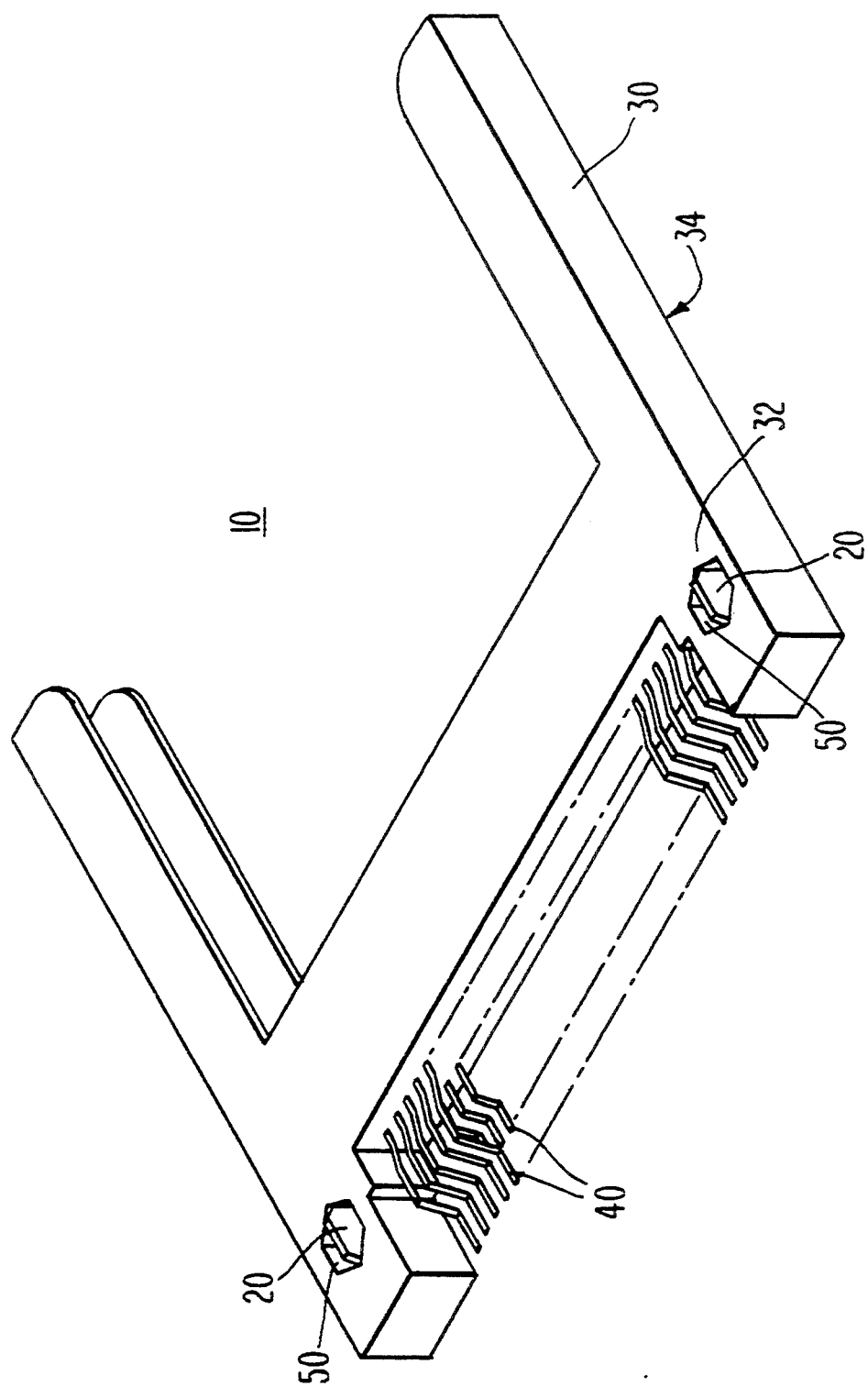
FIG. 1 illustrates a perspective view of an electrical connector having conventional boardlock retaining apertures for accepting a self-retaining boardlock in accordance with the invention.

Throughout this application, similar reference numerals refer to similar elements in all figures.

The present invention relates to an electrical connector having a boardlock with barbs for securing the electrical connector to a printed circuit board ("PCB") and for preventing the boardlock from falling loose from the electrical connector before installation. The boardlock of the invention is preferably accepted in a hexagonal recess in the top side of the electrical connector which is typically used for accepting hex nuts which operate with a screw to hold the electrical connector to the PCB. However, unlike prior art boardlocks, the boardlock of the invention is retained in the boardlock retaining aperture without providing an interference fit by instead designing the boardlock to have a tab at one end and self-retaining barbs at the other end. This is accomplished in accordance with the invention by disposing the barbs on spring means which cause the barbs to have an outer diameter wider than that of the boardlock retaining aperture when sprung so that the barbs may function to retain the boardlock in the boardlock retaining aperture during shipment. These and other features of the invention will become more apparent and better appreciated by one skilled in the art from the following detailed description.

FIG. 1 illustrates a perspective view of a surface mount electrical connector 10 including a self-retaining boardlock 20 in accordance with the present invention. As shown in FIG. 1, electrical connector 10 comprises a dielectric housing 30 and electrical contacts 40. As known to those skilled in the art, electrical connector 10 preferably receives a memory card but may also receive a ribbon cable and the like for connection to the electrical contacts 40. As shown, the electrical connector 10 further comprises hexagonal-shaped recesses 50 for accepting hexagonal nuts which mate with screws received via through holes such as aperture 130 in FIG. 4. In accordance with the invention, the hexagonal recesses 50 and the through holes are further used to accept the self-retaining boardlock 20 of the invention for retaining the electrical connector 10 of the invention to a printed circuit board ("PCB") by aligning the boardlocks 20 with boardlock receiving apertures of the PCB (see FIG. 4). Once the electrical connector 10 is retained in contact with the PCB, the electrical contacts 40 preferably contact the desired conductive traces of the PCB.

A preferred embodiment of the invention will now be described with respect to FIGS. 2-6.

As illustrated in FIG. 2, boardlock 20 is preferably planar and has a tab portion 60 at one end and spring means 70 at the other end comprising a first spring 72 and a second spring 74 symmetrically spaced about an axis 80. Tab portion 60 includes shoulders 62 which abut against the bottom 52 of the hexagonal recess 50 of the electrical connector 10 to prevent the boardlock 20 from passing into the through hole and out the other end of the through hole of the electrical connector 10. As shown in FIG. 2, tab portion 60 further includes a top portion 64 which preferably extends slightly above the top face 32 of the dielectric housing 30 as best illustrated in FIG. 4. Preferably, top portion 64 of tab portion 60 is bevelled at 66 so that the boardlock 20 has no sharp or ragged edges. First and second springs 72 and 74 of the spring means 70 diverge slightly from point 90 at the top of slot 76 separating springs 72 and 74. As a result, springs 72 and 74 are wider at the end 100 removed from tab portion 60 than at the end adjacent to tab portion 60.

Springs 72 and 74 comprise pairs of symmetric barbs 110 which function to provide an interference fit with a boardlock retaining aperture 160 of the PCB 140 and to retain the boardlock 20 within the through hole 130 of the electrical connector 10 of the invention as shown in FIG. 4. The latter is accomplished in accordance with invention by designing the boardlock 20 such that the tip to tip distance between barbs 112 in the first barb pair is greater than the outer diameter of the through hole 130 of the electrical connector 10 when the springs 72 and 74 are sprung and such that the barbs 112 in the first barb pair are far enough down the spring means 70 so that the barbs 112 extend below the mounting face 34 of the electrical connector 10 when shoulders 62 abut bottom portion 52. The spring action of springs 72 and 74 thus retains the boardlock 20 within the boardlock retaining aperture 130 of the electrical connector 10 at mounting face 34 while tab portion 60 retains the boardlock 20 within the hexagonal recess 50 at the top face 32 of the electrical connector 10. Additional barbs 114 and 116 are also preferably provided to facilitate the interference fit of the boardlock 20 with the walls of the boardlock receiving aperture 160 of the PCB 140.

Figure 6:
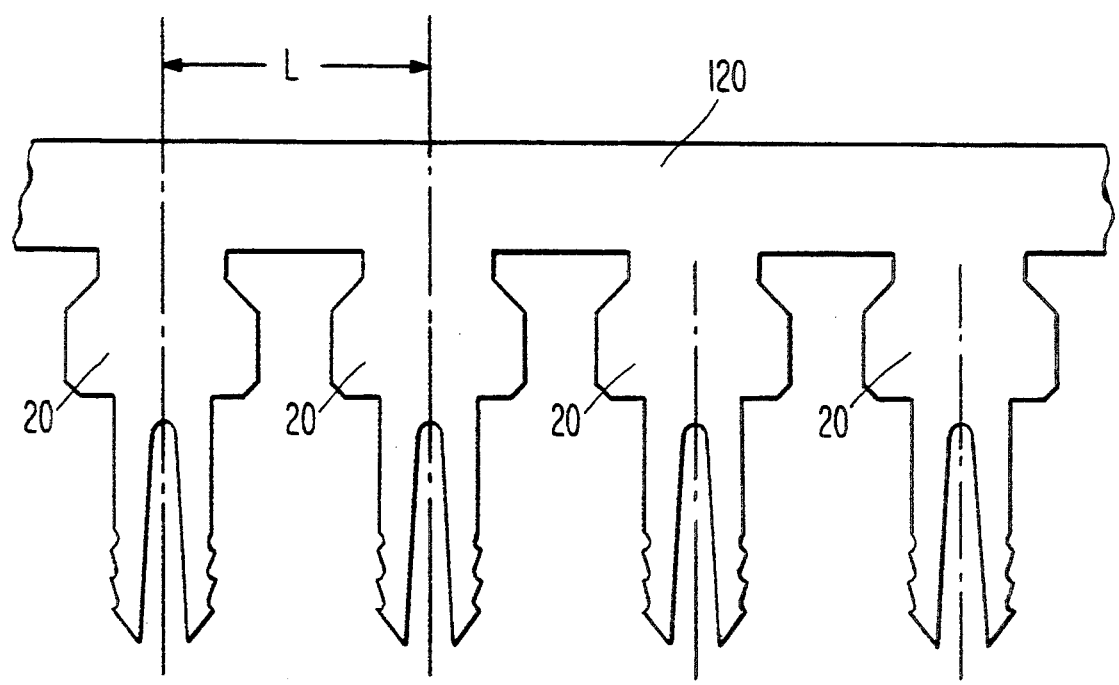
FIG. 6 illustrates a plurality of boardlocks of the invention as stamped from a sheet of metal.

As illustrated in FIG. 3, the boardlock 20 of the invention is preferably flat. In a preferred embodiment, boardlock 20 is stamped from flat stock 120 at a spacing L between the respective axes 80 of the boardlocks 20 as shown in FIG. 6. Preferably, flat stock 120 is comprised of brass, phosphor bronze, steel, or a copper alloy. Preferably, this flat stock 120 is plated with a tin-lead solder coating to enhance solder wetting.

FIG. 4 illustrates an end view, partially in section, of a boardlock 20 secured in a boardlock retaining aperture 130 of the electrical connector 10 with the electrical connector 10 connected to printed circuit board 140 in accordance with the invention. As shown, shoulders 62 of tab portion 60 of boardlock 20 abuts the bottom portion 52 of hexagonal-shaped recess 50 to prevent the boardlock 50 from passing into the aperture 130. As illustrated at 150, tab portion 60 preferably has a clearance with the side walls of the hexagonal-shaped recess 50 so that no interference fit with recess 50 results. The tips of the first pair of barbs 112 extend below mounting face 34 and pass into a boardlock receiving aperture 160 of PCB 140 to provide an interference fit at 170 with the walls of the boardlock retaining aperture 160 of PCB 140. As shown, the top portion 64 of tab portion 60 preferably extends slightly above the top face 32 of the dielectric housing 30 of electrical connector 10 so that the top portion 64 of the boardlock 20 may be pressed down to prevent the boardlock 20 from backing out during establishment of the interference fit with the PCB 140 at 170. Boardlocks 20 would then hold the electrical connector 10 in place during a subsequent soldering process as desired.

FIG. 5 illustrates a top view of the boardlock 20 upon insertion into the hexagonal recess 50 and boardlock retaining aperture 130 of electrical connector 10. As shown, the boardlock 20 of the invention extends across opposite corners of the hexagonal recess 50 such that the corners 54 of the hexagonal recess 50 prevent the boardlock 20 from turning within the aperture 130. As a result, no interference fit is necessary to retain the tab portion 60 within the hexagonal recess 50. Indeed, boardlock 20 may fit into hexagonal recess 50 in any of at least three different configurations across the opposite corners 54 of the hexagonal recess 50.

The present invention thus relates to a boardlock 20 which may be retained within a boardlock retaining aperture 130 of an electrical connector 10 during shipment of the electrical connector 10 without danger of falling out. The boardlock 20 has a tab portion 60 at one end for retention purposes and barbs 110 at the other end which, when sprung, have an outer diameter which is greater than that of the boardlock retaining aperture 130. As a result, barbs 110 additionally function to retain the boardlock 20 within the aperture 130 of the electrical connector 10 during shipment. Since retaining means are provided at either end of the boardlock 20, the boardlock 20 need not have an interference fit within the aperture 130. The barbs 110 extend wider than the aperture 130 in the electrical connector 10 during shipment in order to provide the aforementioned retention function; however, during insertion of the barbs into the aperture 160 of the PCB 140, the barbs 110 are pressed together to provide an interference fit 170 with the walls of the aperture 160 of the PCB 140. In a preferred embodiment, the boardlock 20 of the invention is used in a conventional hexagonal recess 50 for acceptance in an aperture 130 normally used for accepting a screw and hex nut combination. The electrical connector assembly of the invention thus allows the user to choose to use a screw and hex nut combination or the boardlock of the invention shipped with the electrical connector 10 and retained therein in accordance with the techniques of the invention.

Those skilled in the art having the benefits of the teachings of the present invention as set forth herein may, of course, effect numerous modifications to the present invention. For example, tab portion 60 could have protrusions formed therein for providing an interference fit with hexagonal recess 50. However, such an embodiment is not presently preferred. In addition, the retaining means for retaining the boardlock within the boardlock receiving aperture of the PCB need not contain barbs but may include other suitable retaining means such as a hook or a latch which holds the underneath surface of the PCB, so long as the retaining means also functions to retain the boardlock in the boardlock receiving aperture of the connector prior to connection to the PCB. Other modifications to the electrical connector assembly of the invention will also become apparent to those skilled in the art and are to be construed as lying within the scope of the present invention as defined by the appended claims.

I claim:

1. An electrical connector for mounting to a printed circuit board ("PCB"), said electrical connector comprising:

a dielectric connector having a plurality of electrical contacts and a boardlock receiving aperture passing through said dielectric connector from a top face to a mounting face; and a boardlock disposed loosely in said boardlock receiving aperture of said dielectric connector, said boardlock having a tab at a first end thereof, said tab having shoulders which prevent said tab from passing through said boardlock receiving aperture of said dielectric connector, and said boardlock having spring means for retaining said boardlock in said boardlock receiving aperture of said dielectric connector, said spring means extending from said tab to a second end of said boardlock which extends beyond said mounting face when said boardlock is disposed in said boardlock receiving aperture of said dielectric connector, said spring means having retaining means positioned along the spring means between said tab and said second end for engaging a boardlock receiving aperture of said PCB for mounting said electrical connector to said PCB, said retaining means being spaced from said tab toward said second end so that said retaining means extends below said mounting face and is sprung outward by said spring means to engage said mounting face around a periphery of said boardlock receiving aperture of said dielectric connector, whereby said tab and said retaining means together retain said boardlock in said boardlock receiving aperture of said dielectric connector when said electrical connector is not mounted on said PCB.

2. An electrical connector as in claim 1, wherein said retaining means comprises at least one pair of barbs which engage walls of said boardlock receiving aperture of said PCB in an interference fit during mounting of said electrical connector to said PCB.

3. An electrical connector as in claim 1, wherein said boardlock receiving aperture of said dielectric connector comprises a hex nut shaped recess for accepting a hex nut and a circular hole concentric with said hex nut shaped recess for accepting a screw, said tab of said boardlock extending across opposite corners of said hex nut shaped recess whereby said opposite corners prevent said boardlock from turning in said hex nut shaped recess, and said shoulders of said tab abut a bottom of said hex nut shaped recess about a periphery of said circular hole when said boardlock is inserted in said boardlock receiving aperture of said dielectric connector.

4. An electrical connector as in claim 3, wherein said spring means comprises first and second springs defining an elongate slot therebetween, said first and second springs diverging from each other as said first and second springs approach said second end, said first and second springs having respective pairs of barbs disposed across from each other on an outer periphery of said boardlock which function as said retaining means, whereby a tip to tip distance between tips of barbs in said respective pairs is greater than an outer diameter of said circular hole of said boardlock receiving aperture.

5. An electrical connector as in claim 3, wherein said tab extends slightly beyond said top face of said dielectric connector when said shoulders abut said bottom of said hex nut shaped recess, whereby said tab may be pressed during insertion of said boardlock into said boardlock receiving aperture of said PCB to prevent said boardlock from backing out of said boardlock receiving aperture of said dielectric connector during mounting of said electrical connector to said PCB.

6. A boardlock for mounting an electrical connector having a boardlock receiving aperture passing therethrough from a top face to a mounting face to a printed circuit board ("PCB") having a boardlock receiving aperture, said boardlock comprising:

a tab at a first end of said boardlock, said tab having shoulders which prevent said tab from passing through said boardlock receiving aperture of said electrical connector; and spring means for loosely retaining said boardlock in said boardlock receiving aperture of said electrical connector, said spring means extending from said tab to a second end of said boardlock which extends beyond said mounting face when said boardlock is inserted into said boardlock receiving aperture of said electrical connector, said spring means fitting loosely in said boardlock receiving aperture at a portion thereof adjacent to said tab and having barbs positioned along the spring means between said tab and said second end for engaging walls of said boardlock receiving aperture of said PCB in an interference fit upon mounting of said electrical connector on said PCB, said barbs being spaced from said tab toward said second end so that said barbs extend below said mounting face and are sprung outward to engage said mounting face around a periphery of said boardlock receiving aperture of said electrical connector, whereby said tab and said barbs together loosely retain said boardlock in said boardlock receiving aperture of said electrical connector when said electrical connector is not mounted on said PCB.

7. A boardlock as in claim 6, wherein said boardlock is substantially flat.

8. A boardlock as in claim 7, wherein said boardlock is stamped out of one of a sheet of brass, a sheet of phosphor bronze, a sheet of steel, and a sheet of a copper alloy.

9. A boardlock as in claim 8, wherein said boardlock is coated with tin-lead solder.

* * * * *